United States Patent [19]

Kato et al.

[11] Patent Number: 5,354,422
[45] Date of Patent: Oct. 11, 1994

[54] PROCESS FOR PRODUCING LEADFRAME MATERIAL FOR SEMICONDUCTOR

[75] Inventors: Kazunori Kato; Hideo Hotta, both of Tokyo, Japan

[73] Assignee: Dai Nippon Printing Co., Ltd., Tokyo, Japan

[21] Appl. No.: 849,343

[22] Filed: Mar. 11, 1992

[30] Foreign Application Priority Data

Mar. 12, 1991 [JP] Japan .................. 3-046635

[51] Int. Cl.$^5$ .............................................. C23F 1/02
[52] U.S. Cl. .................... 156/664; 437/220; 156/666
[58] Field of Search ............... 437/220; 156/664, 666, 156/656

[56] References Cited

U.S. PATENT DOCUMENTS

| | | | |
|---|---|---|---|
| 4,711,700 | 12/1987 | Cusack | 156/651 |
| 4,888,449 | 12/1989 | Crane et al. | 174/52.4 |
| 5,116,458 | 5/1992 | Grabble | 156/664 |

Primary Examiner—Olik Chaudhuri
Assistant Examiner—C. Everhart
Attorney, Agent, or Firm—Wegner, Cantor, Mueller & Player

[57] ABSTRACT

A process for producing a leadframe for a semiconductor including (i) providing nickel or nickel-base alloy plating layers on both sides of a base material including an iron-base material or a copper-base material by electroplating or chemical plating so as to have a single layer thickness in the range of from 3 to 20 microns, (ii) applying a photoresist on both sides of the leadframe material produced in step (i) and forming a leadframe pattern by a patterning process and (iii) subjecting the leadframe material patterned in step (ii) to etching.

2 Claims, 1 Drawing Sheet

PROCESS FOR PRODUCING LEADFRAME MATERIAL FOR SEMICONDUCTOR

BACKGROUND OF THE INVENTION

1. Field of the Invention

The present invention relates to a leadframe material for a semiconductor and a process for producing the same. More particularly, the present invention is concerned with an iron-base or copper-base leadframe having a good etchability, an excellent fine fabricability and a high strength and a process for producing the same.

2. Description of the Related Art

Leadframe materials having various qualities and configurations are known as a leadframe material used for mounting of semiconductors. For example, it is a common practice to mold a leadframe base material rolled to a desired sheet thickness into a pattern having a predetermined configuration by etching or stamping and then subject the whole or predetermined positions of the base material to a surface treatment such as gold plating, silver plating, nickel plating or tin-nickel plating.

An iron-nickel-base Alloy 42 (42% Ni-Fe), an iron-nickel-cobalt-base Kovar (29% Ni-13% Co-Fe) alloy and a copper-base alloy are used as the leadframe material, and the thickness is generally in the range of from 100 to 250 $\mu$m.

In recent years, with the advance of high-density mounting of a semiconductor device, there is an ever-increasing tendency towards an increase in the number of pins and a reduction in the size of the pitch. In the case of mass production through the use of the above-described material, the limitation of the inner lead pitch in the etching is up to about 200 $\mu$m. As the pitch becomes narrow and the number of the pins increases, it becomes difficult to ensure the inner lead flat width necessary for the wire bonding. Further, in this case, since the amount of the side etching increases, shortcircuiting is liable to occur between leads. In particular, the Alloy 42 which is mainly used in the high pin count leadframe is inferior to the copper alloy in the etchability, so that it is difficult to cope with an extreme increase in the number of pins and an extreme reduction in the size of the pitch.

In the conventional etching, it was necessary to reduce the flat width of a back side (bottom side) of the inner leads for the purpose of ensuring the flat width of a face side (top side). Care should be taken not to excessively reduce the flat width of the reverse face because it becomes difficult to maintain the flatness of the inner lead at the time of wire bonding process.

An increase in the number of pins and a reduction in the size of pitch have been attained through a reduction in the thickness of the leadframe material. In this method, however, the lack of the mechanical strength becomes significant with a reduction in the thickness of the leadframe materials. For this reason, high-strength materials of iron-base alloys or copper-base alloys have been developed. In this case as well, however, an extreme reduction in the thickness of the material is impossible from the viewpoint of the material strength, so that the lower limit of the thickness is considered to be in the range of from 80 to 125 $\mu$m.

Further, the Alloy 42 and Kovar commonly used in the art as a leadframe material contain a considerable amount of Ni and Co, so that the unit price of the material is unfavorably high.

SUMMARY OF THE INVENTION

The present invention has been made in view of the above-described problems of the prior art, and an object of the present invention is to provide a leadframe material for a semiconductor which has a good etchability, an excellent fine fabricability and an excellent strength and enables the cost to be reduced, and a process for producing such a leadframe.

In order to attain the above-described object, the leadframe for a semiconductor comprises a base material comprising an iron-base material or a copper material and, provided on both sides of the base material, nickel or nickel-base alloy plating layers having a single layer thickness in the range of from 3 to 20 $\mu$m.

The process for producing a leadframe for a semiconductor according to the present invention comprises the steps of:

(i) providing nickel or nickel-base alloy plating layers on both sides of a base material comprising an iron-base material or a copper-base material by electroplating or chemical plating to have a single layer thickness in the range of from 3 to 20 $\mu$m;

(ii) applying a photoresist on both sides of the leadframe material produced in the step (i) and forming a predetermined leadframe pattern by patterning according to conventional exposure and development procedure; and (iii) subjecting the leadframe material patterned in said step (ii) to etching.

According to the present invention, since a nickel or nickel-base alloy plating layer is provided on both sides of the base material, the etching process causes no side etching (under-cutting) as opposed to the case where an etching process is conducted after a photoresist is directly applied on the conventional material without plating. Therefore, the lead flat width can be made wide, and the wire bonding process as well can be successfully conducted. Further, since the material is reinforced by plating layers, and the section of the etched leadframe is in an arch form, the mechanical strength as well is so excellent that it becomes possible to reduce the thickness of the base material.

DESCRIPTION OF THE PREFERRED EMBODIMENTS

Figure 1A:
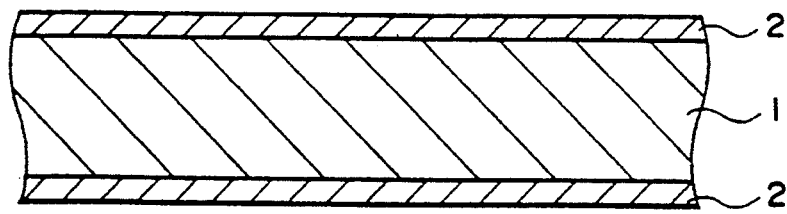
FIGS. 1(a)-1(c) are schematic cross-sectional views showing the process for producing a leadframe according to the present invention.

The material constituting the base material of the leadframe material for a semiconductor according to the present invention is an iron-base material or a copper-base material. Specific examples of the iron-base material include AK steel (an aluminum killed steel), a LC steel (a low carbon steel), and specific examples of the copper-base material include OLIN7025 (manufactured by Olin Corp.), KLF125 (manufactured by Kobe Steel, Ltd.), EFTEC75X (manufactured by The Furukawa Electric Co., Ltd.), OLIN194 (manufactured by Olin Corp.), MF202 (manufactured by Mitsubishi Electric Corp.), EFTEC64T (manufactured by The Furukawa Electric Co., Ltd.), OMCL1 (manufactured by Mitsubishi Shindoh Co., Ltd.) and TAMKAC5 (manufactured by Mitsubishi Shindoh Co., Ltd.). The cost of these iron-base material is lower than that of the Alloy 42 and Kovar commonly used in the art.

The thickness of the base material is preferably in the range of from 50 to 250 μm. Further, as described below, a suitable thickness is selected according to the object of use of the leadframe material.

The nickel or nickel-base alloy plating layers (the term "nickel plating" used herein is intended to mean a nickel or nickel-base alloy plating) is formed on both sides of the base material. The nickel plating can be formed by any of the electroplating and the chemical plating known in the art, and the plating method and plating bath may be selected depending upon the plating thickness, hardness, surface appearance, purity, and state of material. For example, when a coil is plated with the pure nickel layer, the electroplating is preferably used. On the other hand, when a material in a sheet form is plated with a nickel-phosphorus or nickel-boron alloy, the chemical plating is preferably used. It is also possible to form the plating layer by vapor deposition.

The balance in the thickness of the nickel plating between both sides of the base material is important from the viewpoint of the mechanical strength and etchability. Further, in the present invention, although the nickel plating thickness is in the range of from 3 to 20 μm, it is preferred to vary the thickness of the base material and the thickness of the nickel plating according to the purpose of use of the leadframe material. For example, in the case of a material for a narrow pitch leadframe, the thickness of the base material is preferably in the range of from 50 to 100 μm, and the thickness of the nickel plating is preferably in the range of from 3 to 20 μm, still preferably in the range of from 10 to 15 μm. In the case of a material for a low cost leadframe, the thickness of the base material is preferably in the range of from 100 to 250 μm, and the thickness of the nickel plating is in the range of from 3 to 15 μm, still preferably in the range of from 5 to 10 μm. When the thickness of the nickel plating is excessively small, the strength reinforcing effect is small. On the other hand, when the thickness is excessively large, the etchability deteriorates, so that the cost of the material increases.

PRODUCTION OF LEADFRAME

The leadframe of the present invention is formed by subjecting the above-described leadframe material to etching. More specifically, (i) a nickel plating is formed on both sides of a base material comprising an iron-base material or a copper-base material by electroplating or chemical plating to have a single layer thickness in the range of from 3 to 20 μm; (ii) a photoresist is applied on both surfaces of the nickel-plated leadframe material and a predetermined leadframe pattern is formed by patterning comprising conventional exposure and development process; and (iii) the patterned leadframe material is subjected to etching.

The application of a photoresist and the patterning of a leadframe pattern may be conducted by the conventional process. Further, the etching may also be conducted under the conventional treatment conditions, and ferric chloride or the like may be used as the etchant.

EXAMPLES

The present invention will now be described in more detail with reference to the following Examples, though it is not limited to these Examples only.

A 100 μm-thick AK steel (comprising 0.060% by weight of Al, 0.4% by weight of Mn and 0,015% by weight of P with the balance consisting of Fe) was used as a base material, and a nickel plating was formed on both sides of the base material by the electrolytic process so that the single thickness of the Ni plating was 20 μm. A leadframe was prepared from this material.

Figure 1B:
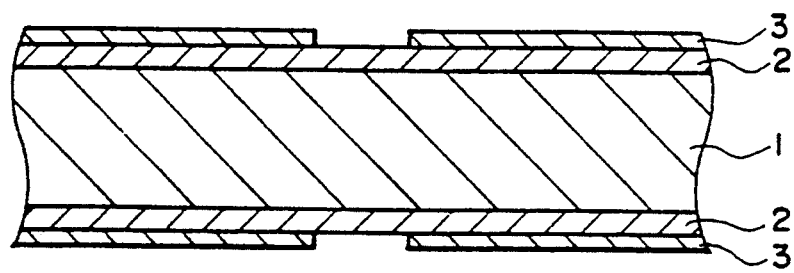
Figure 1C:
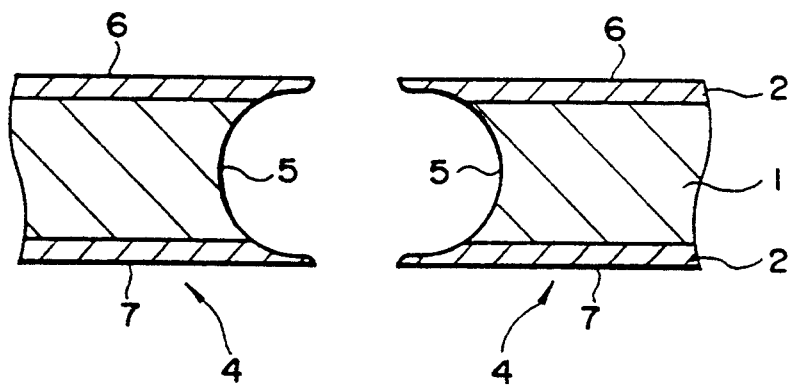

FIG. 1 is a schematic cross-sectional view showing the process for producing the above-described leadframe. At the outset, as shown in FIG. 1(a), a 20 μm-thick nickel plating 2 was formed on both sides of a 100 μm-thick AK steel 1. Then, as shown in FIG. 1(b), after a photoresist 3 was coated on both sides of the plated AK steel, a leadframe pattern was formed. The patterned leadframe material was subjected to an etching treatment, and a photoresist was stripped off to produce a leadframe as shown in FIG. 1(c).

As shown in FIG. 1(c), the frame 4 subjected to an etching treatment is in an arch form wherein a center portion (a base material portion) 5 is in a recessed state because the nickel plating 2 serves as an etching mask. No side etching (under-cutting) is observed, and the width of both sides of lead can be made wide, so that it becomes possible to conduct fine etching. Further, the flat width of the top side (face side) 6 and the flat width of the bottom side (back side) 7 may be simultaneously made large.

According to the leadframe material of the present invention, since a nickel plating is formed on both sides of a base material comprising an iron-base material or a copper-base material so as to have a single thickness in the range of from 3 to 20 μm, even when the iron-base material or copper-base material is thin and lacks in the mechanical strength, the mechanical strength can be compensated for by the nickel plating applied to both sides of the material. Further, since an iron-base material or a copper-base material which is inexpensive is used as the base material, when the thickness of the nickel plating is in the range of from 3 to 15 μm, the material cost is lower than that in the case of the Alloy 42 or Kovar. Further, since the leadframe material of the present invention has a nickel plating on both sides of the base material, the nickel, as such, may be used as a primary plating in the subsequent step. Therefore, the step of primary plating after etching can be omitted, so that the cost and time can be saved.

The lead frame produced by the process of the present invention is free from the side etching (undercutting), enables the flat width of both sides of lead to be made wide and has a fine etchability. For example, it is possible to conduct an etching treatment in an inner lead pitch of about 150 μm, and the leadframe can successfully cope with a reduction in the size of the pitch and an increase in the number of pins. Further, the flat width of the top side and the flat width of the bottom side can be simultaneously made so wide that the subsequent wire bonding process can be successfully conducted. Further, since the material is reinforced by plating layers, and the section is in an arch form, the leadframe is excellent in the strength as well.

What is claimed is:

1. A process for producing a leadframe for a semiconductor, comprising the steps of:
    (i) providing nickel or nickel-base alloy plating layers on both sides of a base material comprising an iron-base material or a copper-base material by electroplating or chemical plating so as to have a single layer thickness in the range of from 3 to 20 μm;

(ii) applying a photoresist on both sides of the leadframe material produced in the step (i) and forming a leadframe pattern by a patterning process; and (iii) subjecting the leadframe material patterned in said step (ii) to etching.

2. The process of claim 1 wherein the patterning process comprises exposing and developing and the etching comprises etching with ferric chloride.

* * * * *